(12) United States Patent
Chen et al.

(10) Patent No.: US 7,419,850 B2
(45) Date of Patent: Sep. 2, 2008

(54) METHOD TO MANUFACTURE A CORELESS PACKAGING SUBSTRATE

(75) Inventors: Bo-Wei Chen, Hsinchu (TW);
Hsien-Shou Wang, Hsinchu (TW);
Shih-Ping Hsu, Hsinchu (TW)

(73) Assignee: Phoenix Precision Technology Corp., Hsinchu (TW)

( * ) Notice: Subject to any disclaimer, the term of this patent is extended or adjusted under 35 U.S.C. 154(b) by 0 days.

(21) Appl. No.: 11/599,983

(22) Filed: Nov. 16, 2006

(65) Prior Publication Data

US 2007/0249154 A1  Oct. 25, 2007

(51) Int. Cl.
*H01L 21/00* (2006.01)
*H01L 21/44* (2006.01)
*H01L 21/4763* (2006.01)

(52) U.S. Cl. .................. 438/106; 438/612; 438/618; 257/E23.145

(58) Field of Classification Search .................. 438/106, 438/612, 622, 382; 257/E23.145
See application file for complete search history.

(56) References Cited

U.S. PATENT DOCUMENTS

| | | | |
|---|---|---|---|
| 2003/0211727 A1* | 11/2003 | Chen et al. ............... | 438/632 |
| 2004/0053489 A1* | 3/2004 | Kata et al. ................ | 438/622 |
| 2004/0169287 A1* | 9/2004 | Honda ..................... | 257/778 |
| 2005/0023033 A1* | 2/2005 | Saiki et al. ............... | 174/260 |
| 2006/0012048 A1* | 1/2006 | Murai et al. .............. | 257/758 |
| 2006/0121719 A1* | 6/2006 | Nakamura et al. ......... | 438/613 |
| 2006/0180908 A1* | 8/2006 | Yano et al. ............... | 257/678 |
| 2006/0223236 A1* | 10/2006 | Nomura et al. ............ | 438/121 |
| 2007/0057363 A1* | 3/2007 | Nakamura et al. ......... | 257/698 |
| 2007/0096292 A1* | 5/2007 | Machida ................... | 257/700 |
| 2007/0132072 A1* | 6/2007 | Chang ...................... | 257/666 |
| 2007/0215490 A1* | 9/2007 | Dow et al. ................ | 205/775 |
| 2007/0231962 A1* | 10/2007 | Fujii ........................ | 438/107 |

* cited by examiner

*Primary Examiner*—Michelle Estrada
*Assistant Examiner*—Kevin A Parendo
(74) *Attorney, Agent, or Firm*—Bacon & Thomas, PLLC

(57) ABSTRACT

A method of manufacturing a coreless packaging substrate is disclosed. The method can produce a coreless packaging substrate which comprises: at least a built-up structure having a first solder mask and a second solder mask, wherein a plurality of openings are formed in the first and second solder mask to expose the conductive pads of the built-up structure; and a plurality of solder bumps as well as solder layers formed on the conductive pads. Therefore, the invention can produce the coreless packaging substrate with high density of circuit layout, less manufacturing steps, and small size.

11 Claims, 6 Drawing Sheets

METHOD TO MANUFACTURE A CORELESS PACKAGING SUBSTRATE

BACKGROUND OF THE INVENTION

1. Field of the Invention

The present invention relates to a method to manufacture a coreless packaging substrate, particularly a method to manufacture a coreless packaging substrate that is applicable to non-through hole structures, to thereby increase density of circuit layout, and streamline manufacture process.

2. Description of Related Art

With the development of the electronic industry, the research is gradually turning to high integration and miniaturization to meet the demands of multi-function, high speed, and high frequency for electronic products. Accordingly in semiconductor packaging, the circuit boards providing circuit connections among active and passive components are evolving from single layer boards to multi-layer boards in order to expand available areas of circuit layout on circuit boards within limited spaces by interlayer connection techniques, so as to accommodate higher wiring density for integrated circuits.

The process of conventional electronic devices proceeds first with providing chip carriers suitable to semiconductor chips, such as substrates or lead frames, then the chip carriers are forwarded to semiconductor packagers to proceed with chip disposing, molding, and ball mounting, etc.; finally, electronic devices having requested functions are produced.

The semiconductor package structures known in the prior art are fabricated by mounting a semiconductor chip on the top of the substrate, followed by wire bonding or flip-chip packaging, and then forming solder balls on the back of the substrate to suffice electrical connections for a printed circuit board. Though high-number leads can be obtained compared with lead frames, usage on higher frequency and operations at higher speed are restricted due to limited performance of the package structure attributed to lacks of both shorter paths of leads due to the core thickness and higher wiring density due to the land width of through holes.

In the method to manufacture a packaging substrate, the whole steps of a conventional technique begins with a core substrate, which is then subjected to drilling, through hole electroplating, hole-plugging, and circuit formation to thereby accomplish an inner layer structure. A multi-layer carrier is then obtained through build-up processes. FIGS. 1A to 1E are schematic illustrations of a prior art. Referring to FIG. 1A, a core substrate 11 is prepared, which is composed of a core layer 111 having a predetermined thickness and a circuit layer 112 formed on the surface thereof. Meanwhile, a plurality of plating through holes 113 are formed in the core layer 111 to thereby electrically connect to the circuit layer 112. Subsequently, as shown in FIG. 1B, the core substrate 11 is subjected to a build-up process. First, a dielectric layer 12 is formed on the core substrate 11 with a plurality of openings 13 corresponding to the circuit layer 112. Then, as shown in FIG. 1C, a seed layer 14 is formed on the surface of the dielectric layer 12 by electroless plating or sputtering, and a patterned resistive layer 15 is formed on the seed layer 14, having a plurality of open areas 150 therein to thereby expose the parts of the seed layer 14. Subsequently as shown in FIG. 1D, a patterned circuit layer 16 and a plurality of conductive vias 13a are formed in the open areas 150 of the resistive layer 15 by electroplating through the seed layer 14, such that the patterned circuit layer 16 is electrically connected to circuit layer 112 through the conductive vias 13a; then the resistive layer 15 is removed and etching is carried out to thereby remove the seed layer 14 covered underneath the resistive layer 15, such that the first built-up structure 10a is formed. Finally, as shown in FIG. 1E, a second built-up structure 10b is formed on the surface of the first built-up structure by repeating the foregoing process, and layers are formed progressively in the same manner to obtain a multi-layer substrate 10.

However, in the process described above, a core substrate is formed by forming circuits on a core layer, followed by a build-up process on the core substrate, thereby forming a multi-layer substrate that complies with the required electrical design. As a result, the thickness of the final multi-layer substrate cannot be reduced, which is unfavorable to the developmental trend of a miniaturized semiconductor package structure. If the thickness of the core substrate is reduced to as thin as 60 µm or less, the manufacture of the multi-layer substrate will be seriously compromised, and the yield from the manufacture of substrate will decrease significantly.

In addition, there are extra steps in the manufacture of the core substrate, such as the hole-plugging and the scrubbing, which elevate the manufacture cost. More importantly, it is necessary to form a plurality of plating through holes in the core substrate; the diameter of the general through hole by drilling is approximately 100 µm or more, while the diameter of the conductive via (laser blind hole) is approximately 50 µm. In comparison, the process of plating through holes makes it more difficult to form a structure with finer circuits.

Moreover, in the process of multi-layer substrate described above, it is required to manufacture a core substrate prior to forming dielectric layers and circuit layers, which consequently complicates the process steps and increases the manufacture time, and raises the manufacture cost as well.

As a result, it is urgent for the industry to avoid the drawbacks of the previous technique, such as the increased thickness of substrate, low wiring density, low yield, complicated process steps, elevated manufacture time and cost.

SUMMARY OF THE INVENTION

In light of the shortcomings of the prior arts described above, the main objective of the present invention is to provide a method of manufacturing a packaging substrate, which can raise the wiring density and reduce the thickness of substrate, to thereby meet the developmental trend of miniaturization.

Another objective of the present invention is to simplify process steps, raise yield, shorten manufacture time, and reduce manufacture cost.

To achieve the above and other objectives, the present invention is to disclose a method of manufacturing a packaging substrate, which includes:

(A) providing a carrier board, and forming a first solder mask on the top surface of the carrier board, wherein a plurality of first openings are formed in the first solder mask to expose parts of the carrier board;

(B) forming a first metal layer in each of the first openings, and forming a first dielectric layer on the surface of the first solder mask and on the first metal layers;

(C) forming a first resistive layer on the surface of the first dielectric layer, and forming a plurality of second openings in the first resistive layer at the positions corresponding to the first metal layer, followed by forming a second metal layer in each of the second openings and then removing the first resistive layer;

(D) forming a built-up structure on the surface of the first dielectric layer and the second metal layers, which includes at least a dielectric layer, at least a third metal layer of patterned circuit, a plurality of conductive vias, as well as a plurality of conductive pads;

(E) forming a second solder mask on the built-up structure, wherein a plurality of third openings are formed in the second solder mask to expose the conductive pads of the built-up structure; and (F) removing the carrier board and the first metal layers to thereby expose parts of the bottom surfaces of the first dielectric layer, and forming a plurality of fourth openings in the first dielectric layer to expose parts of the bottom surfaces of the second metal layers.

Thereby the coreless packaging substrates prepared by the present invention have higher layout integration, simpler manufacturing procedures, and reduced general product thickness, and the goal of miniaturization is achieved.

The packaging substrate fabricated by the method of the present invention can be further subjected to a step (G), forming a solder bump in each of the third openings in the second solder mask, and forming a solder layer in each of the first openings in the first solder mask.

Besides, the method of the present invention can further comprise a step (H), after forming the solder bumps and the solder layers in step (G): attaching at least a metal supporting frame on the surface of the second solder mask, so as to increase general rigidity of the substrate.

In addition, the method of the present invention can further comprise a step (F1) before forming the solder bumps in the third openings and forming the solder layers in the first openings in step (G): forming a fourth metal layer as a post in at least one of the third openings in the second solder mask and the first openings in the first solder mask along with the fourth openings in the first dielectric layer, to thereby reduce the quantity of solder material needed for the solder bumps as well as the solder layers.

The build-up process to form a built-up structure in step (D) is well known in the art; thus the details are not described further here, wherein a multi-layer built-up structure can be obtained by repeating the build-up process.

Other objects, advantages, and features of the invention will become more apparent from the following detailed description when taken in conjunction with the accompanying drawings.

DETAILED DESCRIPTION OF THE PREFERRED EMBODIMENT

Figure 1A:
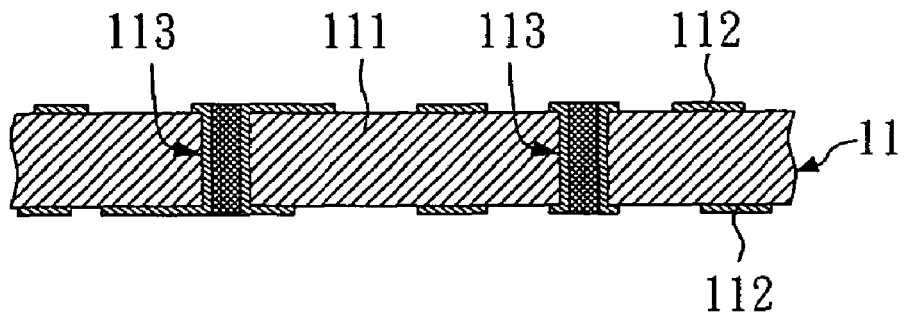
FIGS. 1A to 1E are cross-sections of the process to make a conventional core packaging substrate.
Figure 1B:
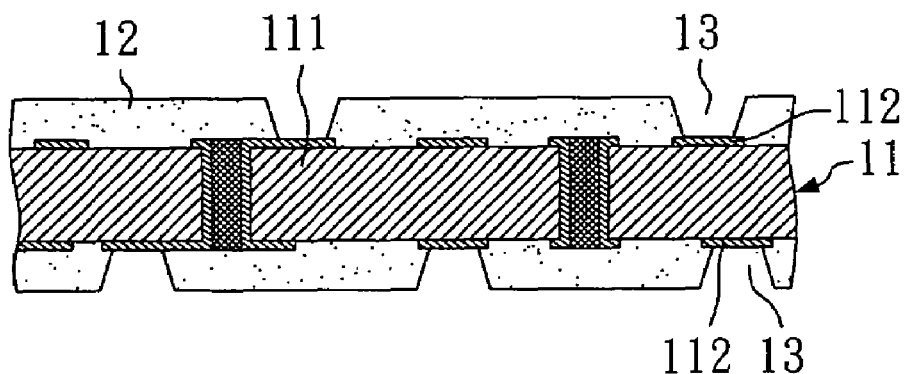
Figure 1C:
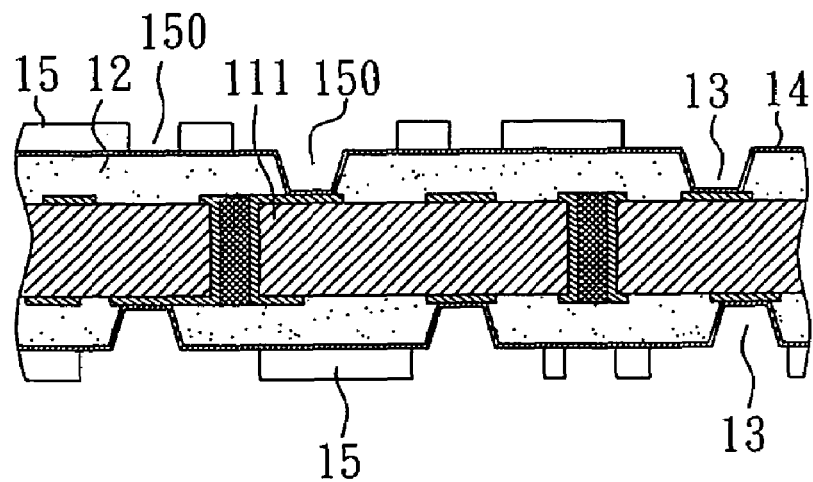
Figure 1D:
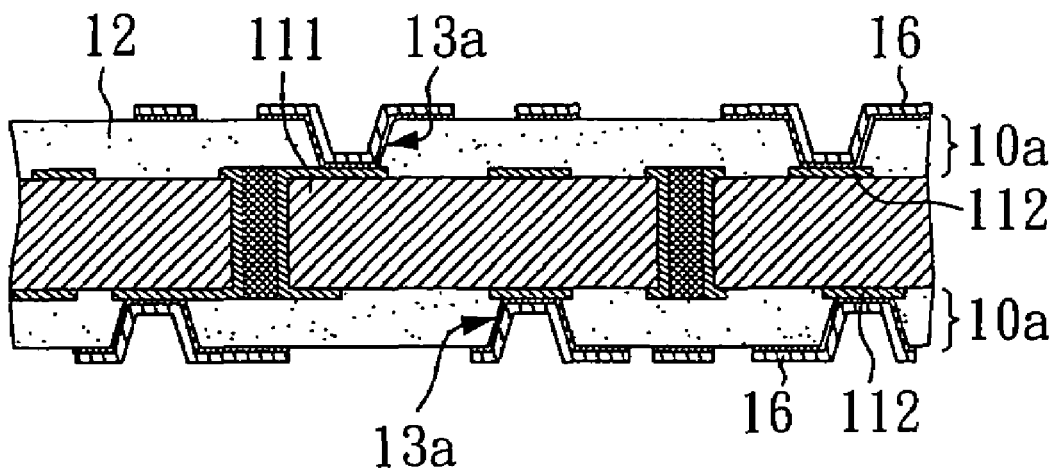
Figure 1E:
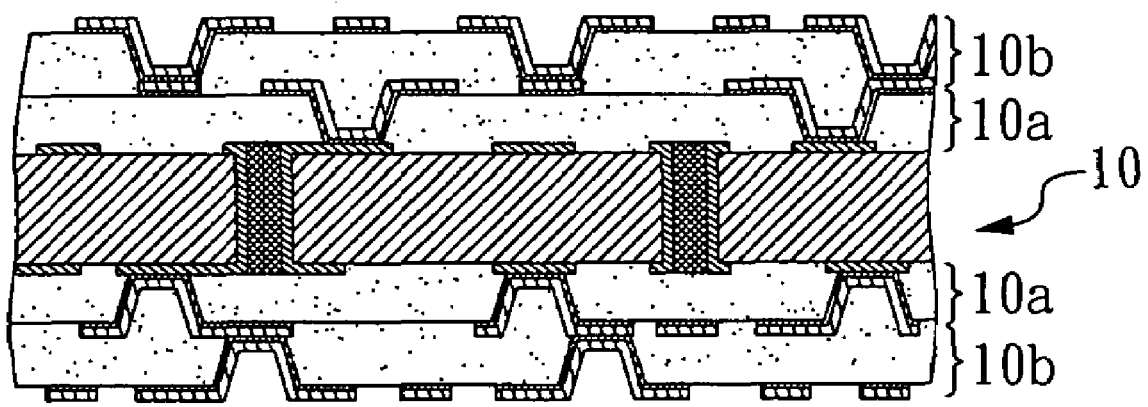
Figure 2A:
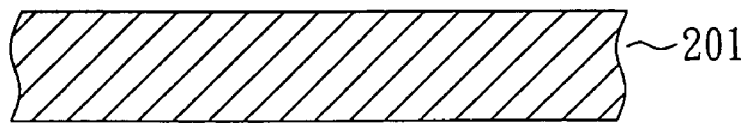
FIGS. 2A to 2S are cross-sections of a preferred embodiment of the coreless packaging substrate of the present invention.
Figure 2B:
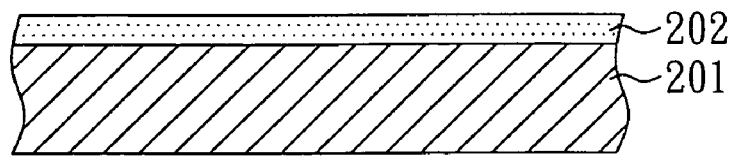
Figure 2C:
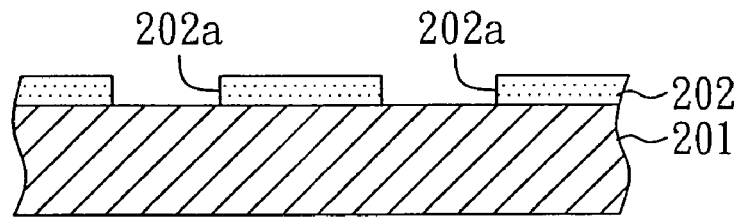
Figure 2D:
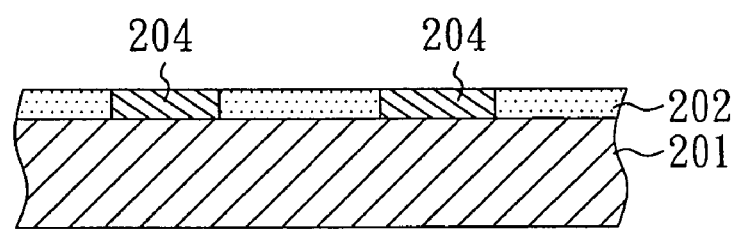
Figure 2E:
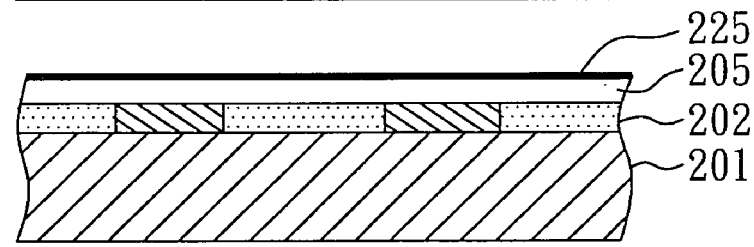
Figure 2F:
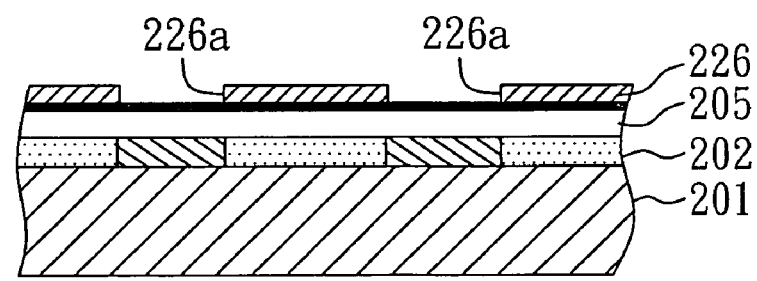
Figure 2G:
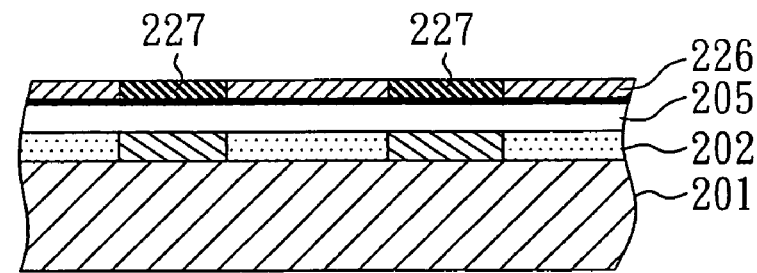
Figure 2H:
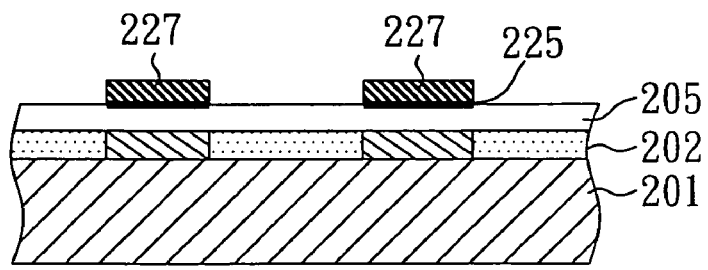
Figure 2I:
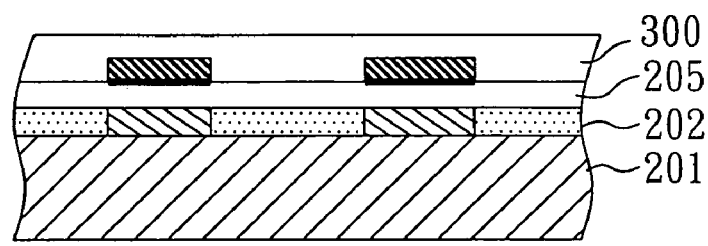
Figure 2J:
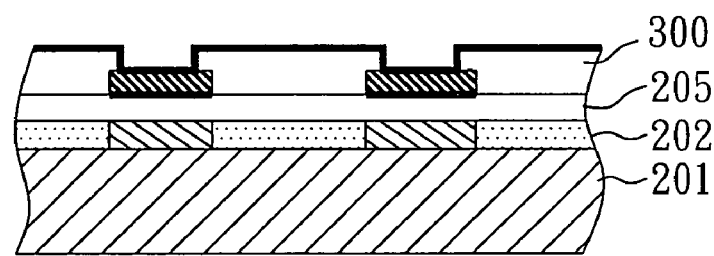
Figure 2K:
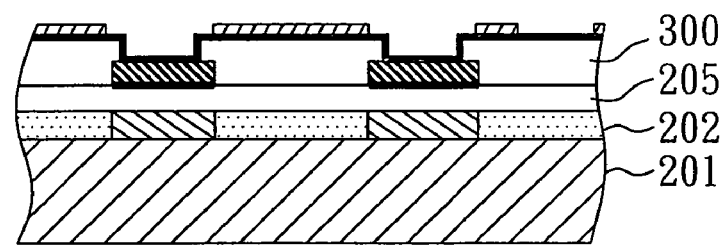
Figure 2L:
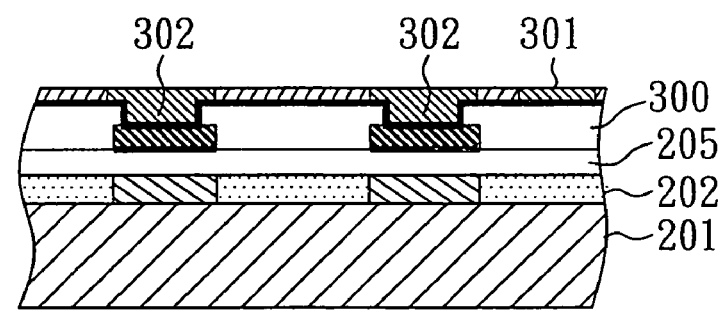
Figure 2M:
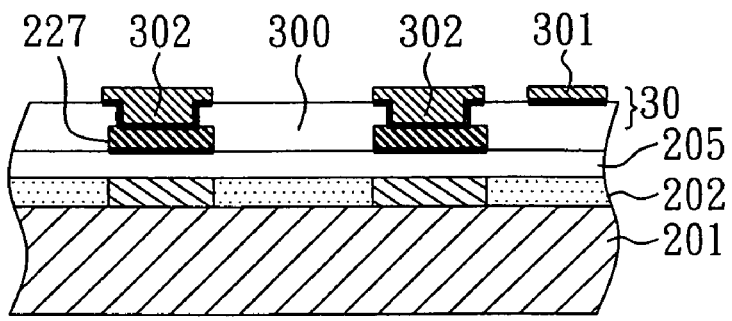
Figure 2N:
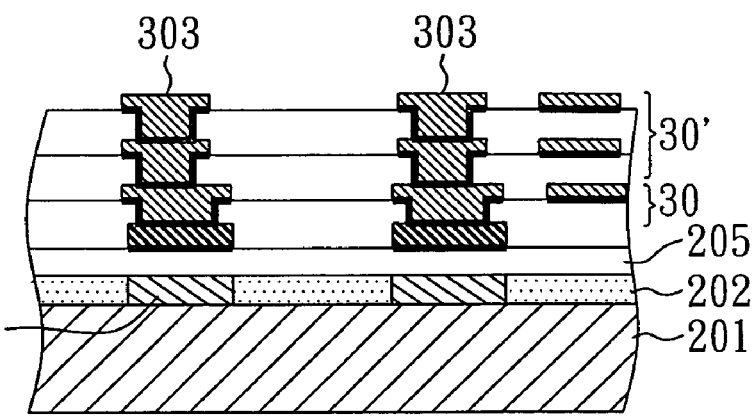
Figure 2O:
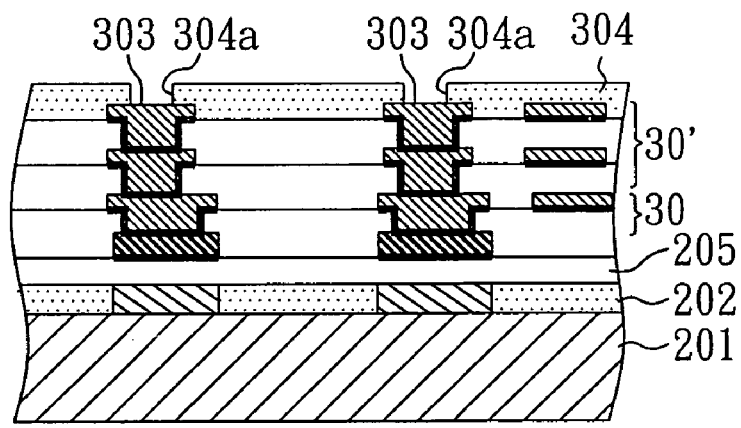
Figure 2P:
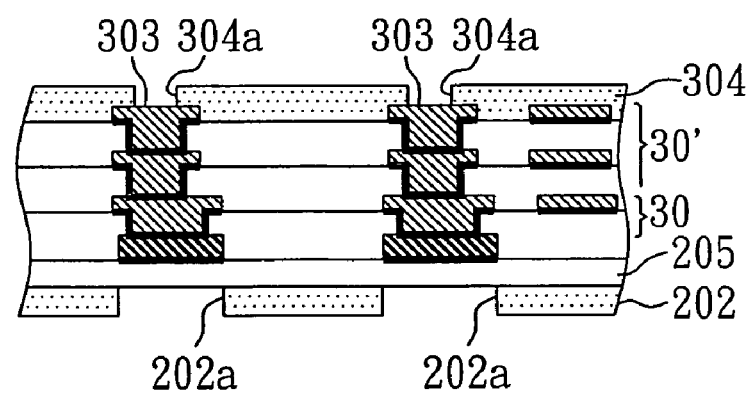
Figure 2Q:
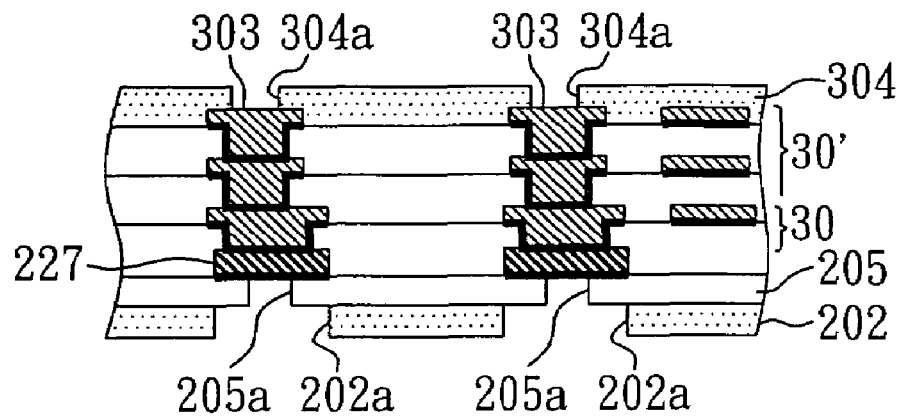
Figure 2R:
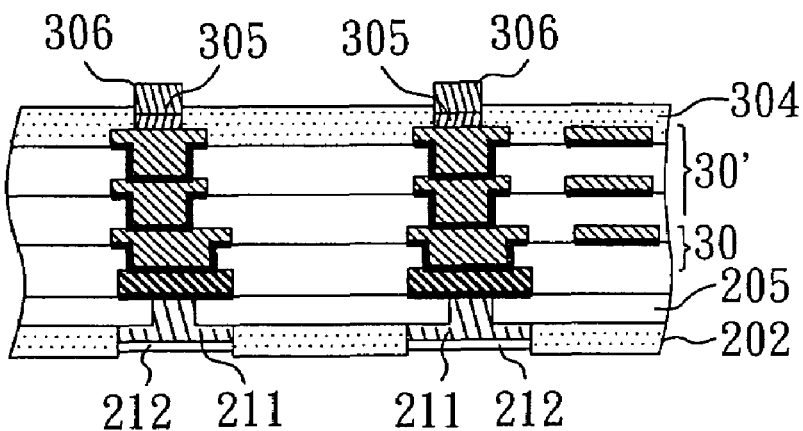
Figure 2S:
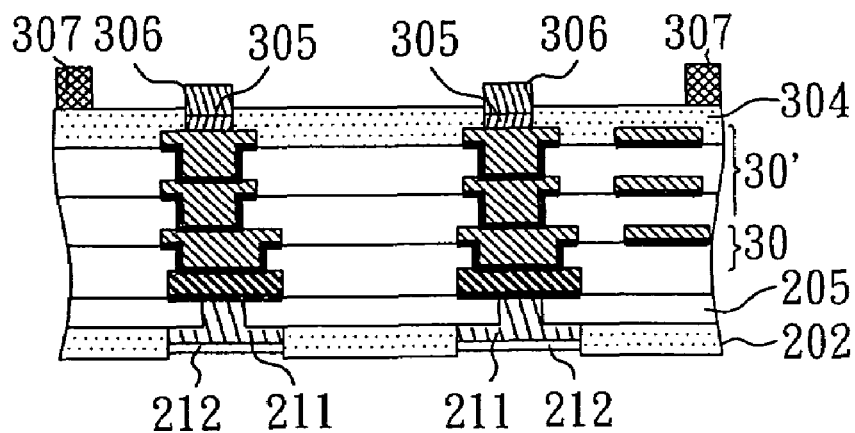

FIGS. 2A to 2S are schematic cross-section illustrations of a coreless packaging substrate of a preferred embodiment of the present invention. First, as shown in FIG. 2A, a metal carrier board 201 is provided; then as shown in FIG. 2B, a first solder mask 202 is formed on the carrier board 201. Referring to FIG. 2C, a plurality of first openings 202a are formed in the first solder mask 202 by photolithography to expose parts of the carrier board 201 underneath.

Subsequently, as shown in FIG. 2D, a first metal layer 204 is formed in each of the first openings 202a. Referring to FIG. 2E, a first dielectric layer 205 made of ABF (Ajinomoto Build-up Film) is formed on the surfaces of the first solder mask 202 and the first metal layer 204. Besides, a seed layer 225 is formed on the surface of the first dielectric layer 205.

Referring further to FIG. 2F, a first resistive layer 226 is formed on the surface of the seed layer 225, wherein the first resistive layer 226 is a dry-film photoresistive layer in this example, and a plurality of second openings 226a is formed by photolithography in the first resistive layer 226 to expose parts of the seed layer 225 underneath. Referring to FIG. 2G, a second metal layer 227 is formed in each of the second openings 226a. Then referring to FIG. 2H, the first resistive layer 226 is removed, and the seed layer 225 covered by the first resistive layer 226 is removed by etching.

Afterwards, as shown in FIGS. 2I to 2M a built-up structure 30 is formed on the surfaces of the first dielectric layer 205 and the second metal layer 227 by the build-up process well known in the art; thus the details are not described further here. Wherein the built-up structure 30 includes a dielectric layer 300, a third metal layer 301 of patterned circuit, and a plurality of conductive vias 302, as shown in FIG. 2M.

Referring to FIG. 2N, another two built-up structures 30' are formed on the built-up structure 30, which includes a plurality of conductive pads 303.

Further referring to FIG. 2O, a second solder mask 304 is formed on the surface of the built-up structure 30' for insulation, and a plurality of third openings 304a are formed in the second solder mask 304 by photolithography to expose the conductive pads 303 of the built-up structure 30'.

Then as shown in FIG. 2P, the carrier board 201 and the first metal layer 204 are removed by etching to thereby expose parts of the bottom surfaces of the first dielectric layer 205. As shown in FIG. 2Q, a plurality of fourth openings 205a are formed by laser ablation in the first dielectric layer 205 to expose parts of the bottom surfaces of the second metal layers 227.

Further referring to FIG. 2R, a fourth metal layer 211,305 is formed in each of the third openings 304a of the second solder mask 304, as well as formed in the fourth openings 205a of the first dielectric layer 205 and the first openings 202a of the first solder mask 202. In the example, solder bumps 306 and solder layers 212 are formed on the surface of the fourth metal layer 211,305, wherein the fourth metal layer 211,305 serves as a post to thereby reduce the quantity of solder material needed for the solder bumps 306 as well as the solder layers 212. Finally, as shown in FIG. 2S, a metal supporting frame 307 is attached upon the solder mask 304 to increase overall rigidity of the coreless packaging substrate.

In the embodiment above, the method to form the first openings 202a in the first solder mask 202 in FIG. 2C as well as the second openings 226a in the first resistive layer 226 in FIG. 2F and the third openings 304a in the second solder mask 304 in FIG. 2O is photolithography, while the method of forming the fourth openings 205a in the first dielectric layer 205 in FIG. 2Q is laser ablation.

In the embodiment above, the method to form the first metal layer 204 in FIG. 2D as well as the second metal layer 227 in FIG. 2G, the third metal layer 301 in FIGS. 2L, 2M, and the fourth metal layer 211,305 in FIG. 2R is one of electroplating and electroless plating, while the method of forming the solder bump 306 along with the solder layer 212 in FIG. 2R is one of electroplating and printing.

In the embodiment above, the first metal layer 204 in FIG. 2D as well as the second metal layer 227 in FIG. 2G, the third metal layer 301 in FIGS. 2L, 2M, and the fourth metal layer 211,305 in FIG. 2R is selected from one of copper, aluminum, tin, nickel, chromium, and an alloy of a combination of the above metals, while the solder bump 306 along with the solder layer 212 in FIG. 2R is selected from one of tin, gold, nickel, chromium, titanium, silver, copper, aluminum, lead, and an alloy of a combination of the above metals.

Thus, the coreless packaging substrate fabricated in this example has higher density of circuit layout, simplified process, and reduced overall product thickness, so as to achieve the goal of miniaturization.

Although the present invention has been explained in relation to its preferred embodiment, it is to be understood that many other possible modifications and variations can be made without departing from the scope of the invention as hereinafter claimed.

What is claimed is:

1. A method to manufacture a coreless packaging substrate, comprising the following steps:
   (A) providing a carrier board, and forming a first solder mask on a top surface of the carrier board, wherein a plurality of first openings are formed in the first solder mask to expose parts of the carrier board;
   (B) forming a first metal layer in each of the first openings, and forming a first dielectric layer on a surface of the first solder mask and on the first metal layers;
   (C) forming a first resistive layer on a surface of the first dielectric layer, and forming a plurality of second openings in the first resistive layer at positions corresponding to the first metal layer, followed by forming a second metal layer in each of the second openings and then removing the first resistive layer;
   (D) forming a built-up structure on surfaces of the first dielectric layer and the second metal layers, wherein the built-up structure includes at least a dielectric layer, at least a third metal layer of patterned circuit, a plurality of conductive vias, as well as a plurality of conductive pads;
   (E) forming a second solder mask on the built-up structure, wherein a plurality of third openings are formed in the second solder mask to expose the conductive pads of the built-up structure;
   (F) removing the carrier board and the first metal layers to thereby expose parts of bottom surfaces of the first dielectric layer, and forming a plurality of fourth openings in the first dielectric layer to expose parts of bottom surfaces of the second metal layers; and
   (G) forming a solder bump in each of the third openings in the second solder mask, and forming a solder layer in each of the first openings in the first solder mask.

2. The method of claim 1, further comprises a step (F1) before forming the solder bumps in the third openings and forming the solder layers in the first openings: forming a fourth metal layer as a post in at least one of the third openings in the second solder mask and the first openings in the first solder mask along with the fourth openings in the first dielectric layer, to thereby reduce the quantity of solder material needed for the solder bumps as well as the solder layers.

3. The method of claim 1, further comprises a step (H), after forming the solder bumps and the solder layers in step (G): attaching at least a metal supporting frame on a surface of the second solder mask, so as to increase overall rigidity of the substrate.

4. The method of claim 1, wherein the method to form the first openings in the first solder mask in step (A) as well as that to form the second openings in the first resistive layer in step (C) and the third openings in the second solder mask in step (E) is photolithography, while the method to form the fourth openings in the first dielectric layer in step (F) is laser ablation.

5. The method of claim 1, wherein the method to form the first metal layer in step (B) as well as that to form the second metal layer in step (C) and the third metal layer in step (D) is one of electroplating and electroless plating.

6. The method of claim 1, wherein the first metal layer in step (B) as well as the second metal layer in step (C), and the third metal layer in step (D) is selected from one of copper, aluminum, tin, nickel, chromium, and an alloy of a combination of the above metals.

7. The method of claim 1, wherein the method to remove the carrier board and the first metal layer in step (F) is etching.

8. The method of claim 1, wherein the method to form the solder bump as well as the solder layer in step (G) is one of electroplating and printing.

9. The method of claim 1, wherein the solder bump as well as the solder layer in step (G) is selected from one of tin, gold, nickel, chromium, titanium, silver, copper, aluminum, lead, and an alloy of a combination of the above metals.

10. The method of claim 2, wherein the method to form the fourth metal layer in step (F1) is one of electroplating and electroless plating.

11. The method of claim 2, wherein the fourth metal layer in step (F1) is selected from one of copper, aluminum, tin, nickel, chromium, and an alloy of a combination of the above metals.

* * * * *